(12) United States Patent
Sekiyama

(10) Patent No.: US 6,261,965 B1
(45) Date of Patent: Jul. 17, 2001

(54) EFFECTIVE REMOVAL OF UNDESIRABLY FORMED SILICON CARBIDE DURING THE MANUFACTURE OF SEMICONDUCTOR DEVICE

(75) Inventor: Sumio Sekiyama, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/346,895

(22) Filed: Jul. 2, 1999

(30) Foreign Application Priority Data

Sep. 14, 1998 (JP) ................................. 10-260268

(51) Int. Cl.[7] ................. H01L 21/461; H01L 21/4757; H01L 21/302
(52) U.S. Cl. ................. 438/706; 438/707; 438/710; 438/305; 438/597; 438/637; 438/439
(58) Field of Search .................. 438/475, 597, 438/706, 707, 710, 305, 297, 105

(56) References Cited

U.S. PATENT DOCUMENTS

| | | | |
|---|---|---|---|
| 4,283,249 | * | 8/1981 | Ephrath . |
| 5,180,466 | * | 1/1993 | Shin . |
| 5,591,664 | * | 1/1997 | Wang et al. . |
| 5,723,383 | * | 3/1998 | Kosugi et al. . |
| 5,998,302 | * | 12/1999 | Fujisawa . |

OTHER PUBLICATIONS

"A General Mechanism and Dissolution Technique of Oxidation Retardation Layer" by Sumio Sekiyama, Yoshikazu Motoyama, Kenya Iwasaki, Kouichirou Inazawa and Shigeyoshi Kojima, which was starting at p. 355 of Proceedings of symposium on dry process which was held at Waseda University in Nov., 1997.

* cited by examiner

Primary Examiner—Charles Bowers
Assistant Examiner—Stephen W. Smoot
(74) Attorney, Agent, or Firm—Junichi Mimura

(57) ABSTRACT

A manufacturing method of a semiconductor device removes a silicon carbide layer, which is undesirably formed on a surface or the like of a contact hole by dry etching, by plasma treatment using a gas that contains hydrogen. The silicon carbide layer can be effectively removed without causing damage to a substrate by setting the content of hydrogen to 80% or more, a gas flow rate to 50 SCCM or more, and a pressure to 50 mTorr or more.

23 Claims, 6 Drawing Sheets

EFFECTIVE REMOVAL OF UNDESIRABLY FORMED SILICON CARBIDE DURING THE MANUFACTURE OF SEMICONDUCTOR DEVICE

BACKGROUND OF THE INVENTION

1. Field of the Invention

The present invention relates to a manufacturing method of a semiconductor device and, more particularly, to a manufacturing method of a contact hole or an FET having an LDD structure.

2. Description of Related Art

In recent years, contact holes or the like with higher aspect ratios have been in demand mainly due to the increasing microminiaturization of semiconductor integrated circuits.

Contact holes are usually formed by etching insulating films by using resists or the like as masks. When a contact hole with a high aspect ratio is formed by dry etching, the pressure in the etching process is decreased in order to achieve a normal configuration and a higher selection ratio of the contact hole. To obtain the high selection ratio, a C-rich fluorocarbon gas is employed.

Using the C-rich forms a SiC layer on the surface of a silicon substrate in some cases. The SiC layer inhibits oxidation of silicon; therefore, it cannot be eliminated by a technique based on the standard sacrificing oxidation and HF etching. Further, the high resistance of the SiC layer inevitably results in an increased contact resistance because of the formed SiC layer. Hitherto, therefore, the SiC layer has been removed by isotropic radical etching that uses $CF_4$, $SF_6$ or the like.

The problem of the undesirable formation of the SiC layer has been occurring also in the forming process of transistors or an element separating process. The etching technique using $CF_4$, $SF_6$ or the like has been posing a problem because of its high etching speed, in which the underlayer, namely, the silicon layer, is undesirably etched in an attempt to remove only the SiC layer. There has been another problem in that, because the SiC layer is not usually formed evenly, the silicon underlayer in a thinner portion of the SiC layer is etched more deeply, resulting in a rough surface.

SUMMARY OF THE INVENTION

An object of the present invention is to provide a manufacturing method of a semiconductor device that permits effective removal of a SiC layer. The manufacturing method of a semiconductor device in accordance with the present invention has a step for removing a silicon carbide layer formed on a silicon substrate by plasma treatment using a gas that contains hydrogen.

DESCRIPTION OF THE PREFERRED EMBODIMENTS (First Embodiment)

FIG. 1 illustrates a manufacturing method of a contact hole according to a first embodiment of the present invention. The present invention will be described in detail with reference to FIG. 1.

An insulating film is formed on a semiconductor substrate 10 by the CVD process. This embodiment employs the atmospheric CVD process using a tetraethylorthosilicate (TEOS) gas. A boron-doped phospho-silicate glass (BPSG) film 11 which contains 8 percent by weight of boron and 12 percent by weight of phosphorus and which has a thickness ranging from 8000 to 20000 angstroms is formed with the flow rate of the TEOS gas set at 3 l/min.

Figure 1A:
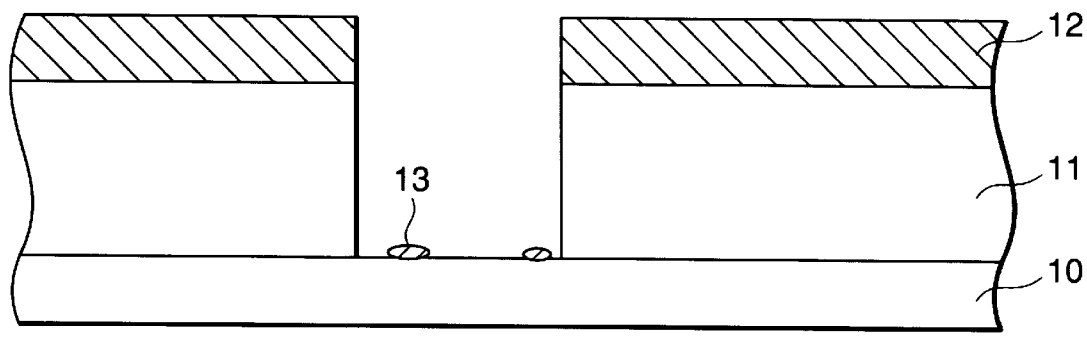
FIGS. 1A through 1C are sequential sectional views of a process of manufacturing a semiconductor device of a first embodiment of the invention.
Figure 6:
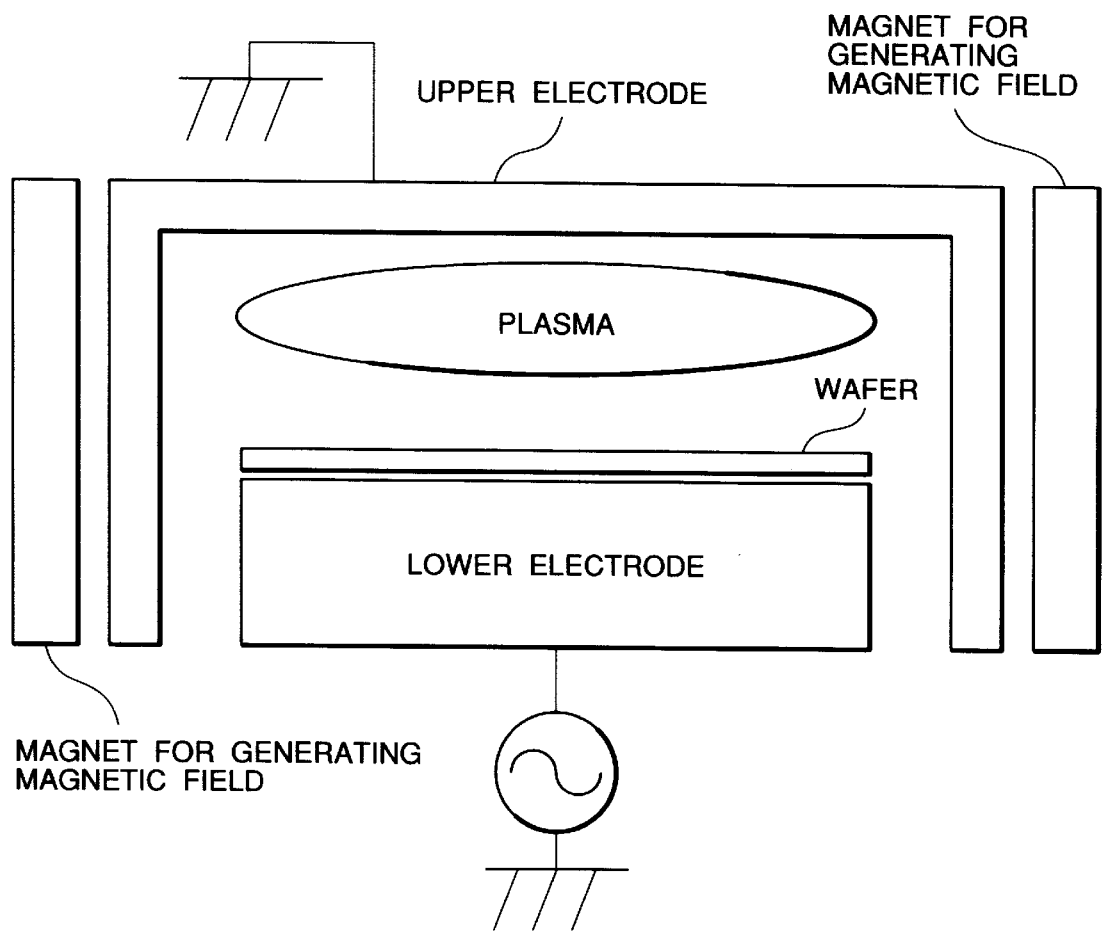
FIG. 6 is a schematic diagram showing an RIE apparatus used in the present invention.

Then, a resist film 12 of a predetermined configuration is formed on the BPSG film 11. Using this resist film 12 as the mask, reactive ion etching (hereinafter referred to as "RIE") that employs $C_4F_8$+CO+Ar. In this embodiment, the etching was carried out by using a parallel plate type RIE etcher made by Tokyo Electron. FIG. 6 is a schematic diagram showing this apparatus. Using the bipolar magnet type magnetron RIE apparatus shown in FIG. 6, the etching is effected for 195 seconds at an output of 1300 W (in terms of 6-inch wafer), a pressure of 57 mTorr, an etching gas ratio of $C_4F_8$/CO/Ar=16/300/400 SCCM, an electrode interval of 25 mm, and a magnetic field rotational speed of 30 rpm. By this etching, the contact hole is formed. After the etching process, the bottom of the formed contact hole has SiC layers 13 in places as shown in FIG. 1A.

The whole surface of the semiconductor substrate is subjected to the plasma treatment using $H_2$. To be more specific, the RIE apparatus used for forming the foregoing contact hole can be used, the gas introduced into a chamber being changed.

The detailed conditions for the $H_2$ plasma treatment will be described in conjunction with FIGS. 2 and 3. The $H_2$ plasma treatment in this embodiment uses an $H_2$+Ar gas. FIGS. 2A through 2C show the film thickness of the thermal oxide film formed on the silicon substrate after the $H_2$ plasma treatment in accordance with the present invention. The figures indicate that the thicker the formed thermal oxide film, the more SiC layer serving as an oxidation suppressing layer has been removed.

Figure 3A:
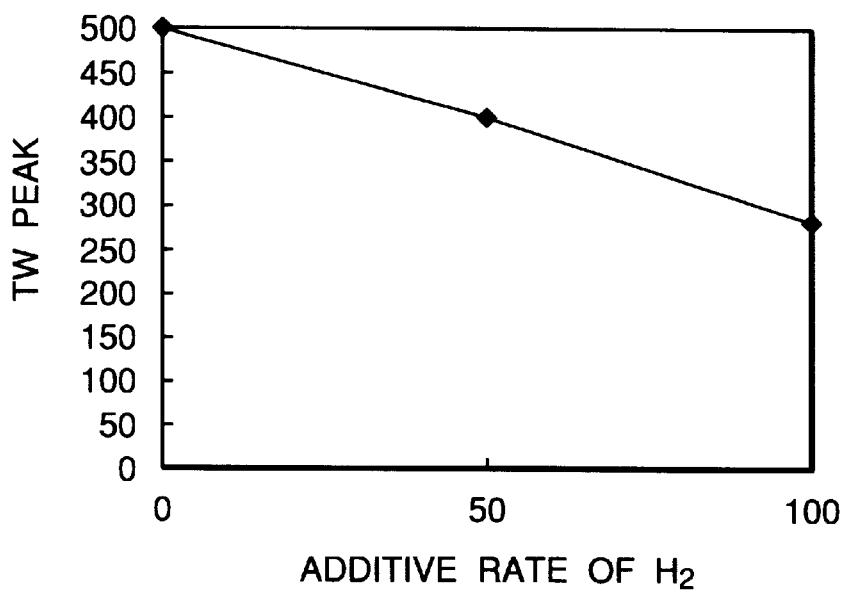
FIG. 3A shows a graph showing the damage to a thermal oxide film as hydrogen volume percentage is changed.
Figure 3B:
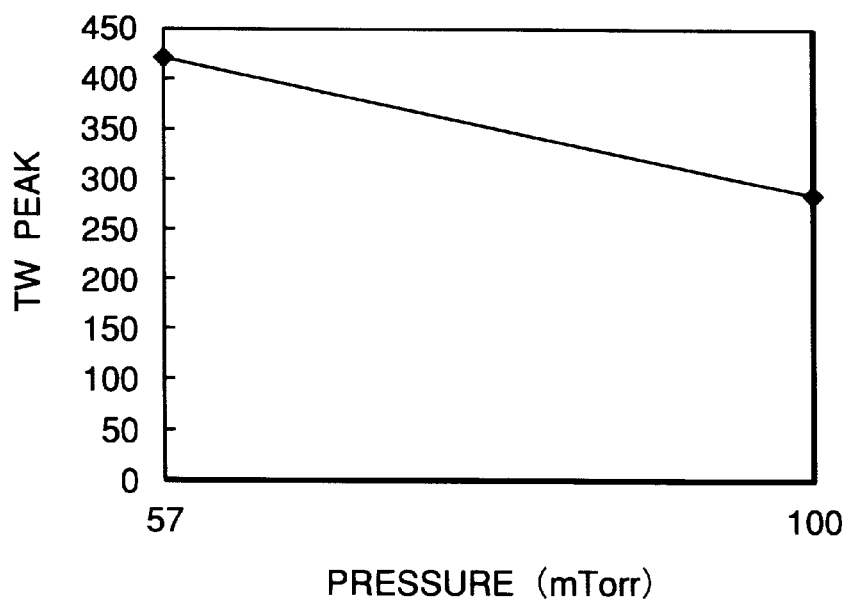
FIG. 3B shows a graph showing the damage to a thermal oxide film as a gas pressure is changed.

FIGS. 3A and 3B indicate how much damage the $H_2$ plasma treatment in accordance with the present invention causes to the silicon substrate. The measurement of the damage was performed using the thermal wave method. The lower the values of the TW peaks in the figures, the smaller the damage is.

Figure 2A:
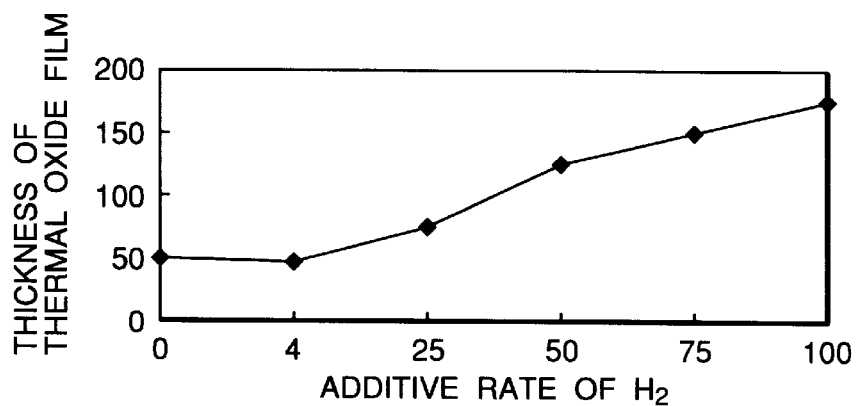
FIG. 2A shows a graph showing the change in thickness of a thermal oxide film as hydrogen volume percentage is changed.

FIG. 2A shows the thickness of the thermal oxide film formed after the volume percentage of the $H_2$ gas is changed. As indicated in the graph, the higher the volume percentage of the $H_2$ gas becomes, the thicker the thermal oxide film is formed. The removal of the SiC layer serving as the oxidation suppressing layer is maximized when the plasma treatment is performed with a 100% volume percentage of the $H_2$ gas.

FIG. 3A shows the damage to the substrate when the volume percentage of the $H_2$ gas is changed. In the case of the damage to the substrate also, the higher the volume percentage of the $H_2$ gas, the less the substrate is damaged.

Thus, the experiment results indicate that the oxidation suppressing layer can be most effectively reduced when the ratio of the $H_2$ gas is set to 100% by volume. In order to obtain satisfactory effect in accordance with the present invention, the ratio of the $H_2$ gas should be at least 80% by volume.

Figure 2B:
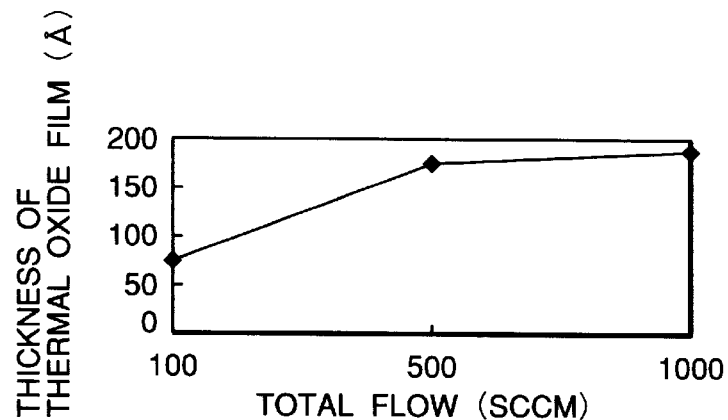
FIG. 2B shows a graph showing the change in thickness of a thermal oxide film as a gas flow rate is changed.

FIG. 2B shows the thickness of the thermal oxide film formed when the gas flow rate is changed, the ratio of the $H_2$ gas being set at 4% by volume. As indicated by the graph, the oxidation suppressing layer is decreased as the flow rate of the gas containing $H_2$ is increased. According to the results of more detailed experiments carried out by the inventors, when the plasma treatment is performed with a gas in which the ratio of the $H_2$ gas is 80% or more by volume, the gas flow should be 50 SCCM or more.

Figure 2C:
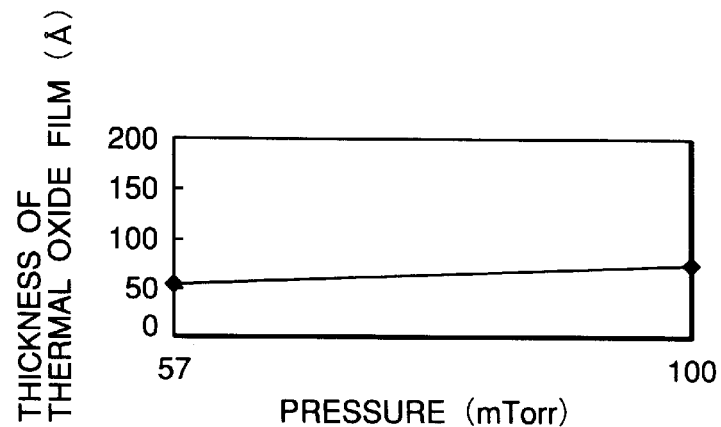
FIG. 2C shows a graph showing the change in thickness of a thermal oxide film as a gas pressure is changed.

FIG. 2C shows the thickness of the thermal oxide film formed when the gas pressure is changed. As indicated by the graph, the oxidation suppressing layer is decreased as the pressure of the gas containing $H_2$ is increased. According to the results of more detailed experiments carried out by the inventors, when the plasma treatment is performed with a gas in which the ratio of the $H_2$ gas is 80% or more by volume, the gas pressure should be 50 mTorr or more.

As explained in detail above, in the $H_2$ plasma treatment in this embodiment, the oxidation suppressing layer can be satisfactorily removed by setting the ratio of the $H_2$ gas at 80% or more by volume, the gas flow rate at 50 SCCM or more, and the gas pressure at 50 mTorr or more.

It has been verified that the $H_2$ plasma treatment process in accordance with the present invention is more effectively performed by using the parallel plate type that is used as a standard RIE apparatus than by an etching apparatus that carries out etching only by radical reaction.

Figure 1B:
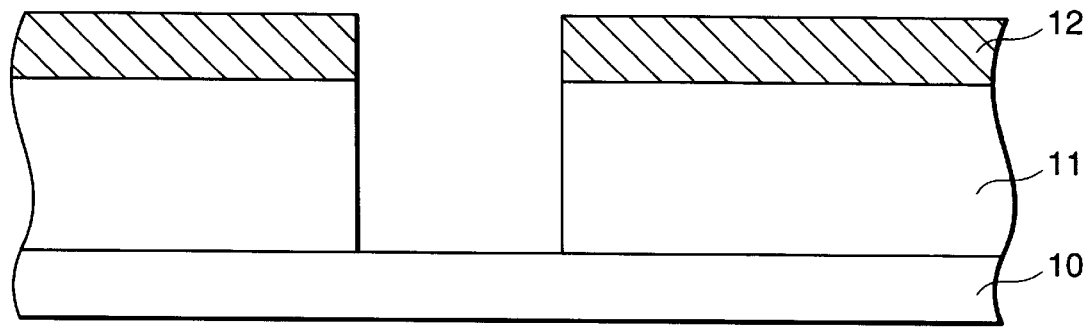
Figure 1C:
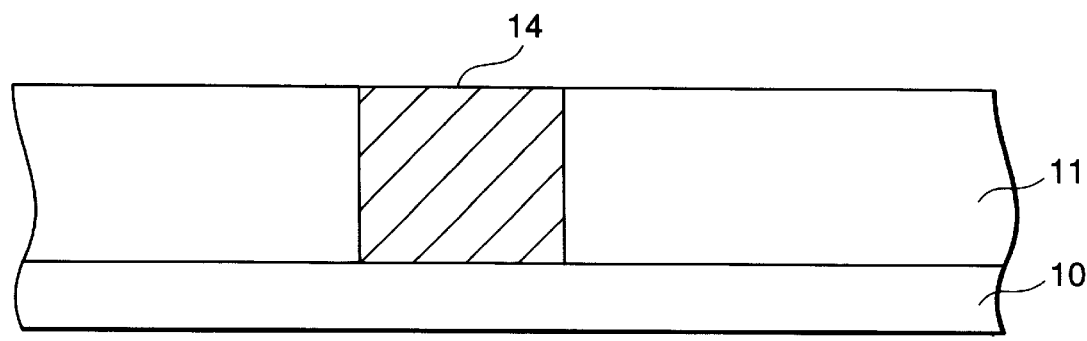

Under the conditions described in detail above, the plasma treatment is carried out with $H_2$. When forming a contact hole, the plasma treatment is performed for 30 to 60 seconds to allow a sufficient time for the $H_2$ gas to reach the lower portion of the contact hole. The plasma treatment removes the SiC layer 13 on the bottom of the contact hole as illustrated in FIG. 1B. After that, the resist film 12 is removed, and AlCu 14 is embedded by sputtering to complete the contact as shown in FIG. 1C.

As described in detail above, the manufacturing method of a semiconductor device in accordance with the present invention performs the plasma treatment using a gas containing $H_2$ after forming a contact hole in the insulating film so as to remove SiC by causing the oxidation suppressing layer, namely, the SiC layer to have the reaction of $SiC+H_2 \rightarrow Si+CH$. Thus, it is possible to form a reliable contact with low contact resistance or the like.

(Second Embodiment)

FIG. 4 shows the steps of the manufacturing method of a semiconductor device in accordance with a second embodiment of the present invention. The present invention will be described in detail with reference to FIG. 4.

First, a gate oxide film 42 is formed on a semiconductor substrate 41. Then, a conductive layer that will provide a gate electrode is formed, and the gate electrode 43 is patterned by the well-known photolithographic process (see FIG. 4A).

Figure 4A:
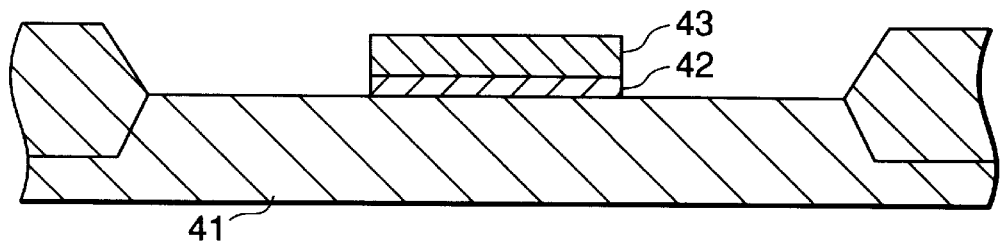
FIGS. 4A through 4E are sequential sectional views of a process of manufacturing a semiconductor device of a second embodiment of the invention.
Figure 4B:
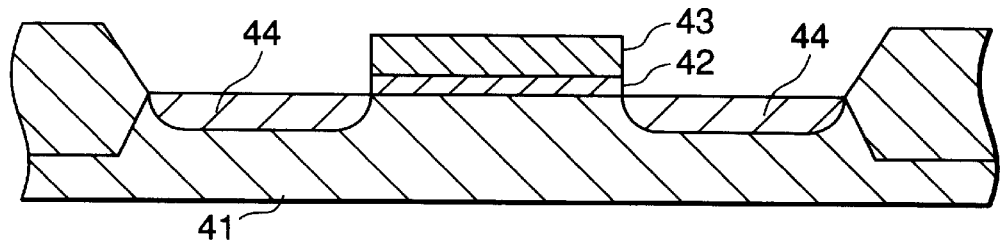

Then, an impurity is introduced by using the gate electrode 43 as the mask to form a low concentration diffusion region 44 (see FIG. 4B).

Figure 4C:
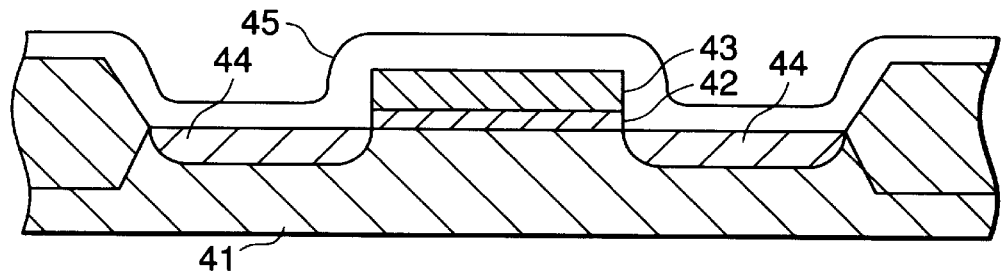
Figure 4D:
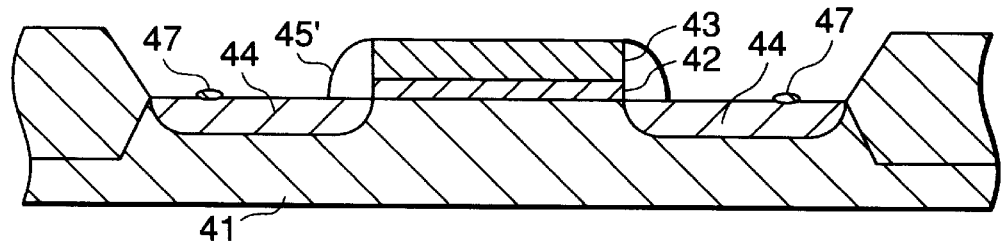
Figure 4E:
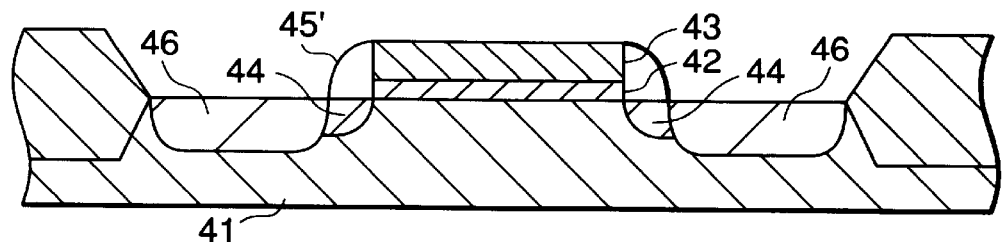

Next, an oxide film 45 is formed on the entire surface of the substrate (see FIG. 4C). Subsequently, the RIE is effected using the aforesaid etching apparatus to form a side wall 45' on a side surface of the gate electrode 43. By this time, a SiC layer has been formed on a part of the Si substrate surface (see FIG. 4D).

After that, the plasma treatment using the $H_2$+Ar gas is effected on the entire surface of the semiconductor substrate in the same chamber as that used for forming the side wall 45'. The detailed conditions are the same as those in the first embodiment. The SiC layer 47, which is the oxidation suppressing layer, can be satisfactorily removed by setting the ratio of the $H_2$ gas at 80% or more by volume, the gas flow rate at 50 SCCM or more, and the gas pressure at 50 mTorr or more. The plasma treatment is carried out for about 10 to about 20 seconds. Then, a high concentration diffusion region 46 is formed by using the gate electrode 43 and the side wall 45' as the masks (see FIG. 4E).

After that, an insulating film is formed on the entire surface of the substrate, then the contacts of the source and the drain are opened to complete a MOSFET having the LDD structure.

The manufacturing method of a semiconductor device in accordance with the present invention removes the SiC layer 47, which is the oxidation suppressing layer, after the side wall 45' is formed. Hence, the diffusion of the high concentration impurity layer 46 does not cause a thin portion to be produced in the diffusion layer, thus permitting a reliable MOSFET having the LDD structure to be formed.

(Third Embodiment)

A third embodiment will now be described in detail.

The third embodiment shares the same steps as those of the first embodiment up to the step for forming the BPSG film on the semiconductor substrate. Following the step, a resist film of a predetermined configuration is formed on the BPSG film. Using the resist film as the mask, the RIE is effected using $C_4F_8+H_2+Ar$ to form a contact hole. In this embodiment, etching is performed using a parallel plate type RIE etcher.

More detailedly, the contact hole is formed using a bipolar magnet type magnetron RIE apparatus under the following conditions: output of 1500 W; a pressure of 50 mTorr; an etching gas ratio of $C_4F_8/H_2/Ar$=16/50/100 SCCM; an electrode interval of 25 mm; and a magnetic field rotational speed of 30 rpm. The etching is conducted for 195 seconds.

The RIE using the plasma generated under the above condition makes it possible to form a contact hole without producing a SiC layer on the bottom of the contact hole. Lastly, the resist layer is removed and AlCu or the like is embedded in the contact hole portion by sputtering or the like to complete the formation of the contact.

As in the case of the first embodiment, the manufacturing method of a semiconductor device according to the third embodiment, a reliable contact with a low contact resistance and the like can be formed. Moreover, the same advantage as that of the first embodiment can be obtained by fewer steps.

(Fourth Embodiment)

FIG. 5 illustrates a manufacturing method of a semiconductor device of a fourth embodiment in accordance with the present invention. The present invention will now be described in conjunction with FIG. 5.

First, a PAD oxide film 52 of approximately 300 angstroms is formed on a semiconductor substrate 51. A SiN film 53 of approximately 1900 angstroms is formed on the PAD oxide film 52 by the LP-CVD process. Then, the patterning of a resist 54 is effected on an area in the SiN film 53, the area corresponding to a region where predetermined elements are formed (see FIG. 5A).

Subsequently, using the resist 54 as the mask, the RIE with a gas containing carbon is implemented to remove the SiN film 53. Poor selectively of PAD oxide film 53 and the substrate causes the Si substrate 51 to be partly exposed and a SiC layer 55 to be formed in places (see FIG. 5B).

The plasma treatment using the $H_2$+Ar gas is conducted on the entire surface of the semiconductor substrate in the same chamber as that used for removing the SiN film 53. The same detailed conditions as those in the first embodiment apply. Satisfactory removal of the oxidation suppressing layer can be accomplished by setting the ratio of the $H_2$ gas at 80% or more by volume, the gas flow rate at 50 SCCM or more, and the gas pressure at 50 mTorr or more. The plasma treatment is performed for 10 to 20 seconds.

Figure 5A:
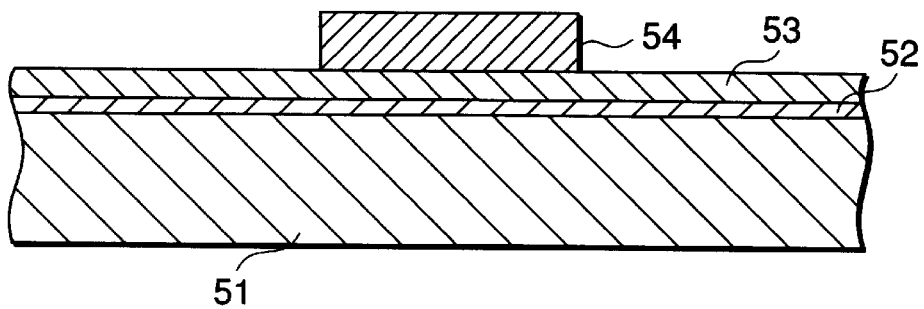
FIGS. 5A through 5D are sequential sectional views of a process of manufacturing a semiconductor device of a fourth embodiment of the invention.
Figure 5B:
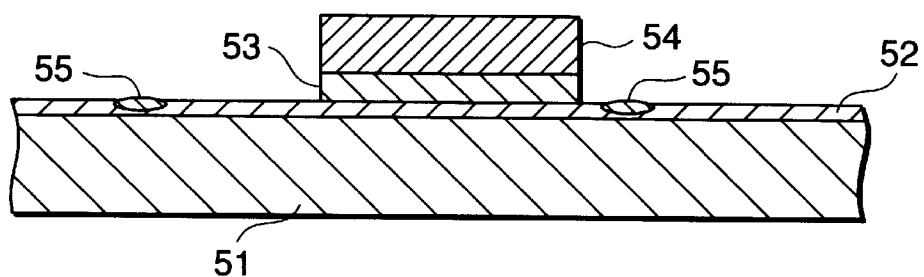
Figure 5C:
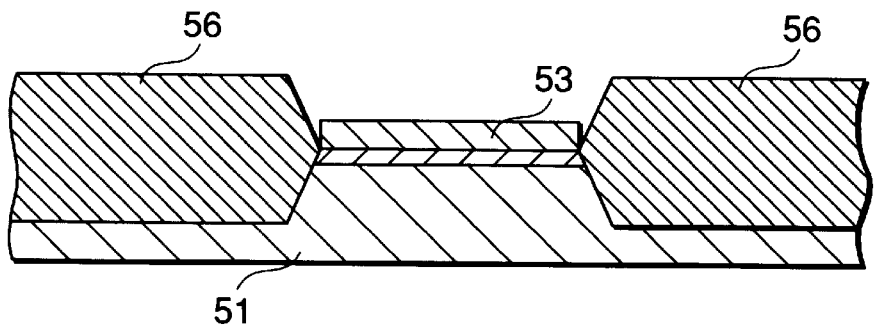
Figure 5D:
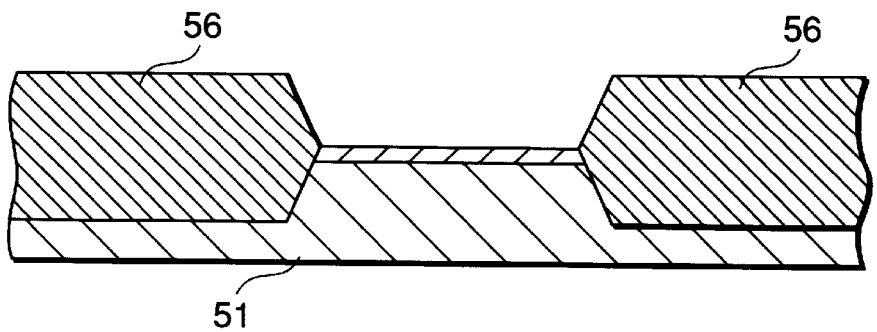

After removing the resist 54, the entire surface of the substrate is thermally oxidized to form a field oxide film 56 that provides an element separating region (see FIG. 5C).

Lastly, the SiN film 53 is removed to complete the formation of the element separating region.

The manufacturing method of a semiconductor device in accordance with the present invention removes the SiC layer 55, which is an oxidation suppressing layer, so that the field oxide film 56 can be fully oxidized, enabling a reliable element separating region to be formed.

The embodiments in accordance with the present invention have referred to the cases wherein the SiC layer is undesirably produced when etching with the C-rich gas is employed. However, even when no C-rich gas is employed, the SiC layer is also produced in some cases if the peak voltage Vpp for generating plasma is high (2.5 to 3 kV) and if a gas containing carbon is used with the etching apparatuses employed in the embodiments of the present invention. The hydrogen plasma treatment in accordance with the present invention is also effective for such a case.

What is claimed is:

1. A method of manufacturing a semiconductor device, comprising the steps of:

forming an insulating film on a semiconductor substrate;

etching a predetermined part of said insulating film using a gas containing carbon to form a contact hole, whereby a silicon carbide layer is formed in the contact hole; and subjecting said semiconductor substrate to a plasma treatment using a gas containing hydrogen to remove the silicon carbide layer, wherein said gas containing hydrogen contains 80% or more hydrogen by volume.

2. A method of manufacturing a semiconductor device according to claim 1, wherein the step of etching the predetermined part of said insulating film using the gas containing carbon to form the contact hole, and the step of subjecting said semiconductor substrate to the plasma treatment using the gas containing 80% or more hydrogen by volume, are implemented in succession in a same chamber.

3. A method of manufacturing a semiconductor device according to claim 1, wherein the step of subjecting said semiconductor substrate to the plasma treatment using the gas containing 80% or more hydrogen by volume is implemented at a gas pressure of 50 mTorr or more.

4. A method of manufacturing a semiconductor device according to claim 1, wherein the step of subjecting said semiconductor substrate to the plasma treatment using the gas containing 80% or more hydrogen by volume is implemented at a gas flow rate of 50 SCCM or more.

5. A method of manufacturing a semiconductor device according to claim 4, wherein the step of subjecting said semiconductor substrate to the plasma treatment using the gas containing 80% or more hydrogen by volume is implemented at a pressure of 50 mTorr or more.

6. A method of manufacturing a semiconductor device, comprising the steps of:

forming an insulating film on a semiconductor substrate;

etching a predetermined part of said insulating film using a gas containing carbon to form a contact hole, whereby a silicon carbide layer is formed in the contact hole; and subjecting said semiconductor substrate to a plasma treatment using a gas containing hydrogen to remove the silicon carbide layer, wherein the step of subjecting said semiconductor substrate to the plasma treatment using the gas containing hydrogen is implemented at a gas flow rate of 50 SCCM or more.

7. A method of manufacturing a semiconductor device according to claim 6, wherein the step of subjecting said semiconductor substrate to the plasma treatment using the gas containing hydrogen is implemented at a gas pressure of 50 mTorr or more.

8. A method of manufacturing a semiconductor device according to claim 6, wherein the step of etching the predetermined part of said insulating film using the gas containing carbon to form the contact hole, and the step of subjecting said semiconductor substrate to the plasma treatment using the gas containing hydrogen, are implemented in succession in a same chamber.

9. A method of manufacturing a semiconductor device, comprising the steps of:

forming an insulating film on a semiconductor substrate;

etching a predetermined part of said insulating film using a gas containing carbon to form a contact hole, whereby a silicon carbide layer is formed in the contact hole; and subjecting said semiconductor substrate to a plasma treatment using a gas containing hydrogen to remove the silicon carbide layer, wherein the step of subjecting said semiconductor substrate to the plasma treatment using the gas containing hydrogen is implemented at a gas pressure of 50 mTorr or more.

10. A method of manufacturing a semiconductor device according to claim 9, wherein the step of etching the predetermined part of said insulating film using the gas containing carbon to form the contact hole, and the step of subjecting said semiconductor substrate to the plasma treatment using the gas containing hydrogen, are implemented in succession in a same chamber.

11. A method of manufacturing a semiconductor device, comprising the steps of:

forming a gate electrode on a semiconductor substrate;

introducing an impurity into said semiconductor substrate using said gate electrode as a mask to form a low concentration diffusion region;

forming an insulating film on the entire surface of said semiconductor substrate;

performing anisotropic etching on said insulating film using a gas containing carbon to form a side wall on said gate electrode, whereby a silicon carbide layer is formed on the semiconductor substrate;

subjecting said semiconductor substrate to a plasma treatment using a gas containing hydrogen to remove the silicon carbide layer; and introducing an impurity into said semiconductor substrate using said gate electrode and said side wall as masks to form a high concentration diffusion region, wherein said gas containing hydrogen contains 80% or more hydrogen by volume.

12. A method of manufacturing a semiconductor device, according to claim 11, wherein the step of subjecting said semiconductor substrate to the plasma treatment using the gas containing hydrogen is implemented at a gas pressure of 50 mTorr or more.

13. A method of manufacturing a semiconductor device, according to claim 11, wherein the step of subjecting said semiconductor substrate to the plasma treatment using the gas containing hydrogen is implemented at a gas flow rate of 50 SCCM or more.

14. A method of manufacturing a semiconductor device, according to claim 13, wherein the step of subjecting said semiconductor substrate to the plasma treatment using the gas containing hydrogen is implemented at a gas pressure of 50 mTorr or more.

15. A method of manufacturing a semiconductor device, comprising the steps of:

forming a gate electrode on a semiconductor substrate;

introducing an impurity into said semiconductor substrate using said gate electrode as a mask to form a low concentration diffusion region;

forming an insulating film on the entire surface of said semiconductor substrate;

performing anisotropic etching on said insulating film using a gas containing carbon to form a side wall on said gate electrode, whereby a silicon carbide layer is formed on the semiconductor substrate;

subjecting said semiconductor substrate to a plasma treatment using a gas containing hydrogen to remove the silicon carbide layer; and introducing an impurity into said semiconductor substrate using said gate electrode and said side wall as masks to form a high concentration diffusion region, wherein the step of subjecting said semiconductor substrate to the plasma treatment using the gas containing hydrogen is implemented at a gas flow rate of 50 SCCM or more.

16. A method of manufacturing a semiconductor device, according to claim 15, wherein the step of subjecting said semiconductor substrate to the plasma treatment using the gas containing hydrogen is implemented at a gas pressure of 50 mTorr or more.

17. A method of manufacturing a semiconductor device, comprising the steps of:

forming a gate electrode on a semiconductor substrate;

introducing an impurity into said semiconductor substrate using said gate electrode as a mask to form a low concentration diffusion region;

forming an insulating film on the entire surface of said semiconductor substrate;

performing anisotropic etching on said insulating film using a gas containing carbon to form a side wall on said gate electrode, whereby a silicon carbide layer is formed on the semiconductor substrate;

subjecting said semiconductor substrate to a plasma treatment using a gas containing hydrogen to remove the silicon carbide layer; and introducing an impurity into said semiconductor substrate using said gate electrode and said side wall as masks to form a high concentration diffusion region, wherein the step of subjecting said semiconductor substrate to the plasma treatment using the gas containing hydrogen is implemented at a gas pressure of 50 mTorr or more.

18. A method of manufacturing a semiconductor device, comprising the steps of:

forming an oxide film on a semiconductor substrate;

forming a nitride film on said oxide film;

forming a resist on a portion of said nitride film that corresponds to an element forming region, and performing anistropic etching on said nitride film using said resist as a mask, whereby silicon carbide layer is formed on the semiconductor substrate;

subjecting said semiconductor substrate to a plasma treatment using a gas containing hydrogen to remove the silicon carbide layer; and forming an element separating region by thermal oxidation, wherein said gas containing hydrogen contains 80% or more hydrogen by volume.

19. A method of manufacturing a semiconductor device, according to claim 18, wherein the step of subjecting said semiconductor substrate to the plasma treatment using the gas containing hydrogen is implemented at a gas flow rate of 50 SCCM or more.

20. A method of manufacturing a semiconductor device, according to claim 19, wherein the step of subjecting said semiconductor substrate to the plasma treatment using the gas containing hydrogen is implemented at a gas pressure of 50 mTorr or more.

21. A method of manufacturing a semiconductor device, comprising the steps of:

forming an oxide film on a semiconductor substrate;

forming a nitride film on said oxide film;

forming a resist on a portion of said nitride film that corresponds to an element forming region, and performing anistropic etching on said nitride film using said resist as a mask, whereby silicon carbide layer is formed on the semiconductor substrate;

subjecting said semiconductor substrate to a plasma treatment using a gas containing hydrogen to remove the silicon carbide layer; and forming an element separating region by thermal oxidation, wherein the step of subjecting said semiconductor substrate to the plasma treatment using the gas containing hydrogen is implemented at a gas flow rate of 50 SCCM or more.

22. A method of manufacturing a semiconductor device, according to claim 21, wherein the step of subjecting said semiconductor substrate to the plasma treatment using the gas containing hydrogen is implemented at a gas pressure of 50 mTorr or more.

23. A method of manufacturing a semiconductor device, comprising the steps of:

forming an oxide film on a semiconductor substrate;

forming a nitride film on said oxide film;

forming a resist on a portion of said nitride film that corresponds to an element forming region, and performing anistropic etching on said nitride film using said resist as a mask, whereby silicon carbide layer is formed on the semiconductor substrate;

subjecting said semiconductor substrate to a plasma treatment using a gas containing hydrogen to remove the silicon carbide layer; and forming an element separating region by thermal oxidation, wherein the step of subjecting said semiconductor substrate to the plasma treatment using the gas containing hydrogen is implemented at a gas pressure of 50 mTorr or more.

* * * * *